United States Patent
Barnett et al.

(10) Patent No.: US 9,063,176 B2
(45) Date of Patent: Jun. 23, 2015

(54) SIGNAL LEVEL CROSSING DETECTOR CIRCUIT

(75) Inventors: Iain Barnett, Lasswade (GB); William Michael James Holland, Edinburgh (GB); Jonathan Ephraim David Hurwitz, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/106,730

(22) Filed: May 12, 2011

(65) Prior Publication Data

US 2011/0279163 A1    Nov. 17, 2011

(30) Foreign Application Priority Data

May 12, 2010 (GB) ................................. 1007892.1
May 12, 2010 (GB) ................................. 1007896.2

(51) Int. Cl.
| | |
|---|---|
| *H03K 5/153* | (2006.01) |
| *G01R 19/12* | (2006.01) |
| *G01R 15/16* | (2006.01) |
| *G01R 15/06* | (2006.01) |

(52) U.S. Cl.
CPC ............... *G01R 19/12* (2013.01); *G01R 15/06* (2013.01); *G01R 15/16* (2013.01)

(58) Field of Classification Search
CPC ........................................... H03K 5/151–5/159
See application file for complete search history.

(56) References Cited

U.S. PATENT DOCUMENTS

| | | | |
|---|---|---|---|
| 4,247,790 A | 1/1981 | Sahasrabudhe et al. | |
| 5,471,043 A * | 11/1995 | Knapp et al. | 235/462.43 |
| 6,781,422 B1 * | 8/2004 | Yang | 327/108 |
| 6,841,080 B2 * | 1/2005 | Kingon et al. | 216/6 |
| 7,659,845 B2 * | 2/2010 | Bresch | 341/172 |
| 2002/0075962 A1 | 6/2002 | Davis | |
| 2007/0108056 A1 * | 5/2007 | Nyberg et al. | 204/554 |
| 2008/0187037 A1 * | 8/2008 | Bulzacchelli et al. | 375/233 |
| 2010/0057388 A1 * | 3/2010 | LeBrun | 702/67 |
| 2010/0329391 A1 * | 12/2010 | Fukuda et al. | 375/319 |

FOREIGN PATENT DOCUMENTS

| | | |
|---|---|---|
| CN | 1846345 A | 10/2006 |
| CN | 201368896 Y | 12/2009 |
| DE | 3728230 A1 | 3/1989 |

OTHER PUBLICATIONS

Extended European Search Report for EP Application No. 11003933.6-1246 dated Dec. 18, 2012, 5 pages.

* cited by examiner

*Primary Examiner* — Lincoln Donovan
*Assistant Examiner* — Sibin Chen
(74) *Attorney, Agent, or Firm* — Garlick & Markison; Bruce E. Garlick

(57) ABSTRACT

A signal level crossing detector circuit includes a DC isolator and a detector circuit. The DC isolator has at least a first input, which is operable to receive a high voltage AC signal, and at least a first capacitor, a first plate of the first capacitor being electrically connected to the first input. The detector circuit is operable at a low voltage and has at least a first detector input, the first detector input being electrically connected to a second plate of the first capacitor, the low voltage detector circuit being operable to provide a change in output signal in dependence on a high voltage AC signal on the first input crossing a predetermined signal level. The signal level crossing detector may be single ended or differential.

22 Claims, 10 Drawing Sheets

SIGNAL LEVEL CROSSING DETECTOR CIRCUIT

CROSS-REFERENCE TO PRIORITY APPLICATION

This application claims priority under 35 U.S.C. §119(a) to Great Britain Application Serial No. GB 1007892.1 filed May 12, 2010 and to Great Britain Application Serial No. GB 1007896.2 filed May 12, 2010, both of which are incorporated herein by reference in their entirety for all purposes.

BACKGROUND OF THE INVENTION

1. Field of the Invention

The present invention relates to a signal level crossing detector circuit for use in particular but not exclusively in mains voltage powered consumer products.

2. Description of the Related Art

Mains voltage powered consumer products, such as multimedia home networking nodes, are required for reasons of safety to have electrical isolation between mains voltage circuitry and low voltage circuitry. Despite the electrical isolation there is often a need to convey signals across the electrical isolation barrier between the mains voltage circuitry and the low voltage circuitry. The determination of a location in time, such as a zero crossing point, on the mains voltage signal from the low voltage side is an example of such a need involving the conveyance of signals from the high voltage side to the low voltage side. The determination of a location on the mains voltage signal finds application, for example, in providing for synchronization with a mains voltage cycle. Synchronisation with the mains voltage cycle may be used to provide for synchronized communication between and amongst low voltage circuits of multiple networked products, such as multimedia home networking nodes.

A more specific example is the provision of an ISP (Inter-System Protocol) that provides for cooperation between and amongst devices that are operating according to different communications protocols. The ISP involves opening a window once every predetermined number of zero crossings of the mains voltage signal and the sending of a recognised symbol followed by control data that provides for the cooperation. The determination of a location on the mains voltage signal may also find application in monitoring the phase variation of a mains supply to determine whether or not the mains supply is liable to fail. For example, there may be an increased likelihood of failure in supply if there is more than a 2% variation in the phase of a mains supply from a twenty-four hour mean. Precautionary measures may then be taken, such as the engagement of an uninterruptable power supply. According to a more simple application, the determination of a location on the mains voltage signal may be used to determine whether the mains voltage signal is of 50 Hz or 60 Hz. In yet a further application, the determination of a location on the mains voltage signal may be used to adapt the communications channel to optimise channel capacity. More specifically, mains voltage signal location determination may be used as the basis for dividing the mains voltage cycle into parts, with various noise indicative characteristics, such as power level and expected signal to noise ratio, in the different parts being monitored and compared in different communications links. The channel is then adapted in dependence on the comparison of the noise indicative characteristics.

A known electrical isolator circuit 10 for conveying signals from a mains voltage circuit to a low voltage circuit whilst maintaining isolation between the mains and low voltage circuits for subsequent zero-crossing detection is shown in FIG. 1. The electrical isolator circuit 10 comprises an opto-isolator 12 having an infrared light emitting diode (LED) 14 and a photo-transistor 16. A resistor, Rin, 18 in series with the LED limits the current flowing through the LED. A load resistor, Rout, 20 is present in series with the photo-transistor 16 between the photo-transistor and the positive power line. A capacitor, Cload, 22 represents a parasitic capacitance of the electrical circuit connected to the output 24 of the photo-transistor. In use, a high voltage AC signal is applied across the inputs 26 to the electrical isolator circuit to thereby cause operation of the LED 14. Light emitted by the LED is received by the photo-transistor and causes a current to flow in the photo-transistor with the current developed across the load resistor to thereby provide a corresponding voltage at the output 24. A representative high voltage AC signal 28 is shown in FIG. 2 along with a corresponding output voltage 30 from a zero-crossing detector that takes as its input the voltage signal from the output 24. The high voltage AC signal 28 and the corresponding output voltage 30 are not to scale in FIG. 2. More specifically and for example, the high voltage AC signal 28 might be 230 Vrms and the output voltage 30 might be 3.3 volts. In other embodiments, the AC signal 28 might be 110 Vrms or 120 Vrms.

A disadvantage of a zero crossing detector including the electrical isolator circuit of FIG. 1 is its high power dissipation on the low voltage side and, in particular, on the high voltage side. The temporal accuracy of the output 24 depends on the speed at which the isolator circuit 10 is capable of switching with the switching speed being determined by the RC time constant of Rout and Cload. The maximum value of Rout can be determined for a given load and a desired accuracy. The maximum value of Rout and the required voltage swing in turn determine the minimum required photo-transistor current, Ic. The LED forward current, If, is then determined on the basis of the current transfer ratio (CTR) of the opto-isolator having regards to the photo-transistor current, Ic. For high voltage signals, most of the voltage is dropped across Rin. A power dissipation of 0.5 Watts can be expected for a typical opto-isolator and typical values for Rout and Rin. If the forward current, If, is reduced to a significant extent to reduce the power dissipation there is not only a corresponding reduction in the photo-transistor current but also a reduction in the current transfer ratio of the opto-isolator. The combination of these effects results in a much more significant reduction in the output swing, which necessitate an increase in Rout, which in turn decreases the switching speed of the isolator circuit by a corresponding amount. Hence, a zero crossing detector including the electrical isolator circuit of FIG. 1 presents an unacceptable compromise between power dissipation and switching speed.

BRIEF DESCRIPTION OF THE DRAWINGS

Further features and advantages of the present invention will become apparent from the following specific description, which is given by way of example only and with reference to the accompanying drawings, in which.

DETAILED DESCRIPTION

According to a first aspect of the present invention a signal level crossing detector circuit has a DC isolator having at least a first input, which is configured to receive a high voltage AC signal, and at least a first capacitor, a first plate of the first capacitor being electrically connected to the first input, and a detector circuit operable at a low voltage and having at least a first detector input, the first detector input being electrically connected to a second plate of the first capacitor, the low voltage detector circuit being operable to provide a change in output signal in dependence on a high voltage AC signal on the first input crossing a predetermined signal level.

Figure 1:
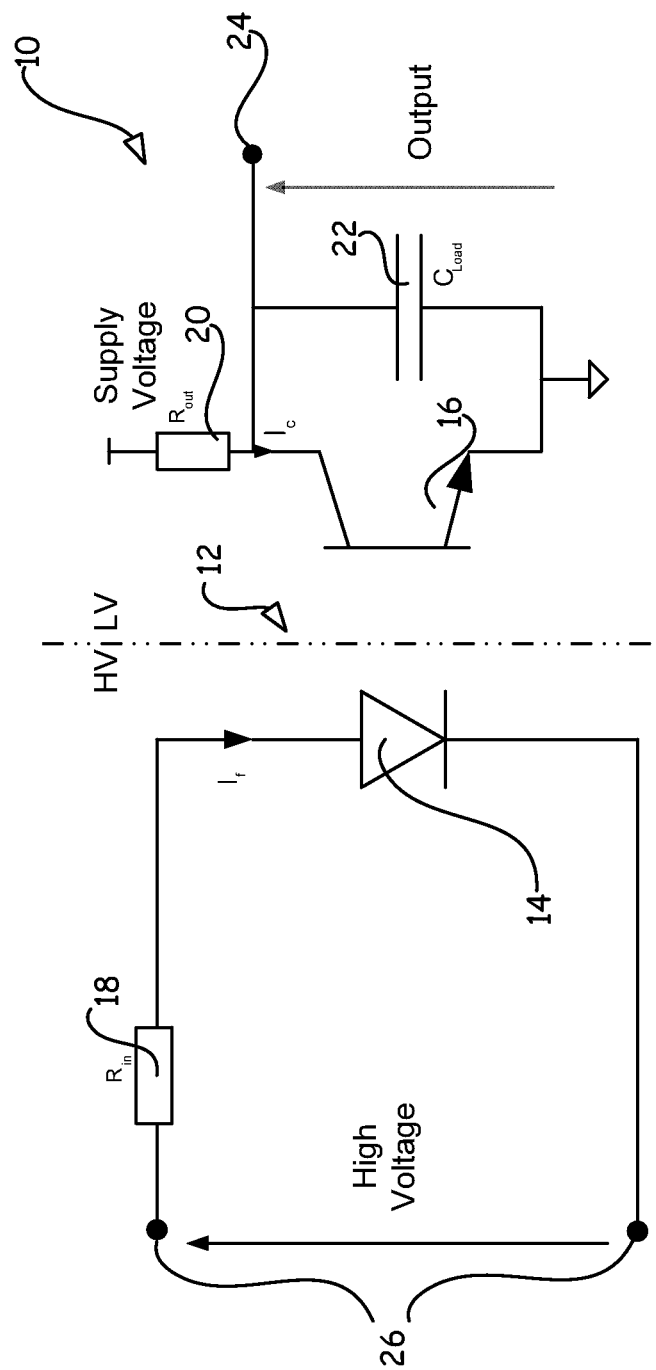
FIG. 1 is a circuit diagram of a prior art electrical isolator circuit.
Figure 2:
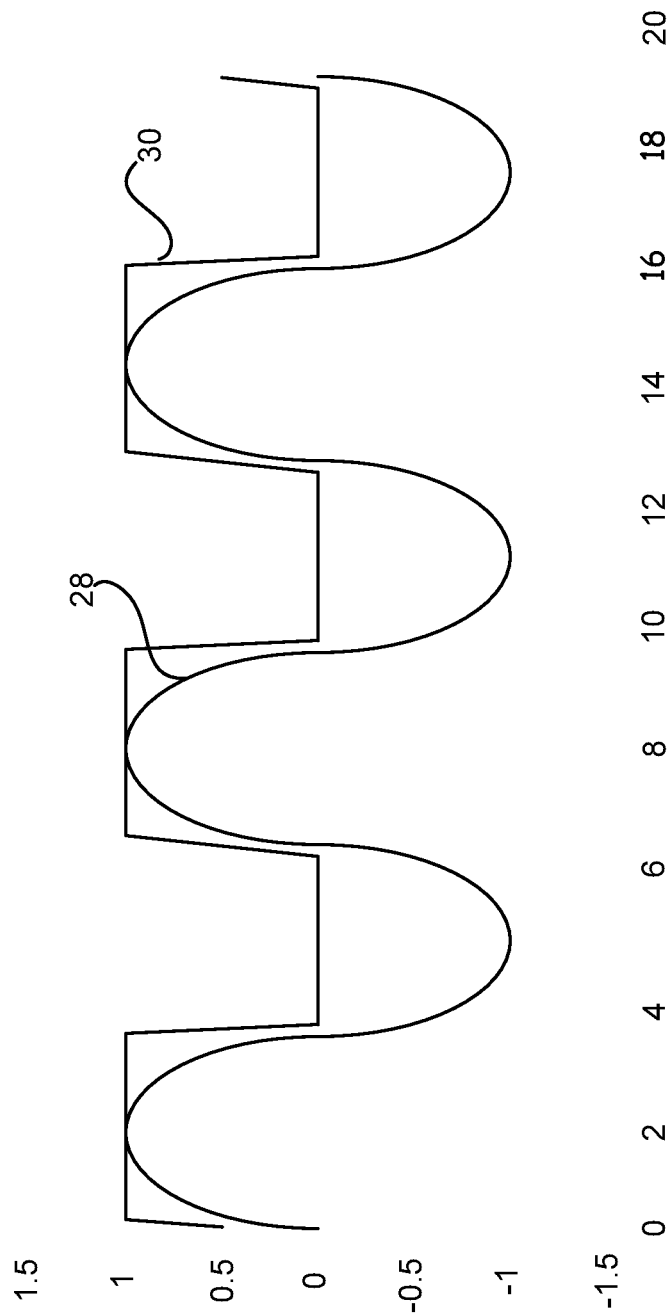
FIG. 2 is a graphical representation of input and output voltages for the circuit of FIG. 1.

In use, the DC isolator of the signal level crossing detector circuit is operative to couple a high voltage AC signal to a detector circuit that is operable at a low voltage. The detector circuit is operative to provide a change in low voltage output signal when the high voltage AC signal crosses a predetermined signal level. Hence, the signal level crossing detector circuit may be used to determine when the high voltage AC signal crosses a predetermined signal level, such as a zero crossing point, with the determination being used to provide for synchronization with a mains voltage cycle. Such synchronization may be of benefit, for example, where the signal level crossing detector circuit is present in each of a plurality of nodes in a multimedia home network to provide for synchronization between and amongst the nodes of the network. The DC isolator circuit normally has a lower power dissipation than the opto-isolator circuit of FIG. 1 because of the large impedance presented by the at least first capacitor at the low frequencies typical of mains AC signals. More specifically, substantially no power is consumed when the circuit is disabled and less power is consumed when the circuit is operative.

The DC isolator may be a differential DC isolator having first and second inputs and outputs and first and second capacitors, the first and second inputs being configured to receive the high voltage AC signal, a first plate of the first capacitor being electrically connected to the first input and a second opposing plate of the first capacitor being electrically connected to the first output, a first plate of the second capacitor being electrically connected to the second input and a second opposing plate of the second capacitor being electrically connected to the second output. In addition, the detector circuit may be a differential detector having first and second detector inputs, the first detector input being electrically connected to the first output from the DC isolator and the second detector input being electrically connected to the second output from the DC isolator. Hence, the detector may be operative to detect when the signals applied to the first and second inputs to the DC isolator cross each other.

More specifically, the signal level crossing detector circuit may further include a load impedance electrically connected in series with the first and second capacitors. The load impedance may have first and second connections, the first connection being electrically connected to the first output from the DC isolator and the second connection being electrically connected to the second output from the DC isolator. Hence, the first capacitor, the load impedance and the second capacitor may be operative as a voltage divider with a reduced level of signal developed across the load impedance and with the reduced level of signal being applied to the inputs of the detector circuit. Thus, the voltage divider may be operative to reduce the high voltage AC signal to a level compatible with the low voltage detector circuit.

More specifically, the load impedance may include a parasitic impedance. The parasitic impedance may be formed at an input to the detector circuit, for example between the inverting and non-inverting inputs of a comparator where the comparator is included in the detector circuit. Alternatively or in addition, the parasitic impedance may be formed by a printed circuit board. A load impedance in the form of a capacitor may have a capacitance of less than substantially 500 pF, such as substantially 200 pF. More specifically, the load capacitance may be less than substantially 200 pF, such as 15 to 20 pF. Where such a load capacitance is insufficient to achieve a desired voltage division, the load impedance may include at least one of a parasitic impedance, e.g. resistance and/or capacitance, and a discrete impedance, such as is provided by a discrete capacitor.

Alternatively or in addition, the load impedance may include a third capacitor. At least one of the first, second and third capacitors may have a capacitance of less than 100 pF. More specifically, each of the first and second capacitors may have a capacitance of less than 50 pF. More specifically, each of the first and second capacitors may have a capacitance of less than 10 pF, such as substantially 5 pF. As regards power dissipation, substantially no power is dissipated in the capacitors.

At least one of the first and second capacitors may be a discrete capacitor, such as a Class X or Y capacitor. The third capacitor may be a discrete capacitor, such as a ceramic capacitor.

Alternatively or in addition, the first and second plates of at least one of the first, second and third capacitors may be defined by conductive layers of a printed circuit board and the dielectric of the at least one capacitor may be defined by a non-conducting part of the printed circuit board.

More specifically, at least one plate of a capacitor may be defined by a layer of metal in or on the printed circuit board. The layer of metal may be formed on a surface, such as an upper or lower surface of the printed circuit board. Hence, first and second plates of a capacitor may be formed on opposing upper and lower surfaces of the printed circuit board such that the non-conducting body of the printed circuit board constitutes the dielectric of the capacitor. Alternatively, at least one layer of metal may be embedded within the printed circuit board. Hence, the first and second plates of a capacitor may be formed within the printed circuit board such that they are spaced apart from each other and with their footprints overlapping, whereby a non-conducting part of the printed circuit board between the first and second plates constitutes the dielectric of the capacitor. The first and second plates may share substantially the same footprint.

In a form of the invention, the first plate of the first capacitor may be defined by a first surface layer on a first surface of the printed circuit board, the first plate of the second capacitor may be defined by a second surface layer on a second opposite surface of the printed circuit board, the second plate of the first capacitor may be defined by a first embedded layer within the printed circuit board and the second plate of the second capacitor may be defined by a second embedded layer having a footprint that overlaps a footprint of the first embedded layer, the first and second embedded layers being spaced apart from each other. Footprints of the first and second surface layers may at least partially overlap the footprints of the first and second embedded layers. Also, the second plate of the first capacitor may be closer to the first plate of the first capacitor than the second plate of the second capacitor. Thus, a first plate of the third capacitor may be defined by the first embedded layer and the second plate of the third capacitor may be defined by the second embedded layer with a dielectric of the third capacitor being defined by a non-conducting part of the printed circuit board between the first and second embedded layers. The first and second embedded layers may be spaced apart from each other to an extent less than a spacing between each of the first surface layer and the first embedded layer and of the second surface layer and the second embedded layer. Hence, the third capacitor may have a larger capacitance than each of the first capacitor and the second capacitor.

Alternatively or in addition, the load impedance may include a resistor. The resistor may have a resistance of more than 1 M Ohm. More specifically, the resistor may have a resistance of substantially 10 M Ohm.

Alternatively or in addition, the signal level crossing detector circuit may further include a first active circuit, which is connected between the first output from the DC isolator and a first predetermined voltage level. In addition, the signal level crossing detector circuit may include a second active circuit, which is connected between the second output from the DC isolator and a second predetermined voltage level. An active circuit may be operative to pull its respective output from the DC isolator between its respective predetermined voltage level and a respective active circuit voltage level. The first and second predetermined voltage levels may be substantially the same, such as zero volts. The respective active circuit voltage level may be determined by a threshold voltage of the active circuit. An active circuit may include first and second diodes in a back to back configuration. The first and second diodes may be formed in an integrated circuit, e.g. as part of a pad Electrostatic Discharge (ESD) protection or otherwise purpose formed. Where the first and second diodes are formed in an integrated circuit, they may be so formed with the detector circuit. Alternatively, the first and second diodes may be formed as discrete circuits. Hence, the first and second diodes may be operative in a first form of signal level crossing detector circuit having a capacitive divider circuit to provide for ESD protection. The active circuit may be operative in a second form of signal crossing detector lacking a capacitive divider circuit to pull its respective output from the DC isolator between its respective predetermined voltage level and a respective active circuit voltage level to thereby provide for detection of crossing of the predetermined signal level.

Alternatively or in addition, the DC isolator may have a single ended configuration. Hence, the DC isolator may include solely a first input, which is configured to receive the high voltage AC signal, and solely a first capacitor.

More specifically, the signal level crossing detector circuit may further include a load impedance electrically connected in series with the first capacitor. The load impedance may have first and second connections, the first connection being electrically connected to the first output from the DC isolator and the second connection being electrically connected to a predetermined voltage, such as ground. Hence, the first capacitor and the load impedance may be operative as a voltage divider with a reduced level of signal developed across the load impedance and with the reduced level of signal being applied to the inputs of the detector circuit. Thus, the voltage divider may be operative to reduce the high voltage AC signal to a level compatible with the low voltage detector circuit. More specifically, the load impedance may include a second capacitor. Alternatively or in addition, the load impedance may include a resistor.

Alternatively or in addition, the detector circuit may include a comparator. Where the DC isolator is of a differential configuration, the first output from the DC isolator may be electrically connected to the non-inverting input of the comparator and the second output from the DC isolator may be electrically connected to the inverting input of the comparator. Where the DC isolator is single ended, the first output (i.e. the sole output) from the DC isolator may be electrically connected to the non-inverting input of the comparator and the inverting input of the comparator may be electrically connected to a predetermined voltage level, e.g. ground. Thus, an output from the comparator may switch between a high voltage level and a low voltage level when the predetermined voltage level is crossed. The high voltage level and low voltage level may, for example, be at or near the high and low supply voltages for the comparator.

Alternatively or in addition, the detector circuit may further include a timer that is operative in dependence on the change of output signal. The change in output signal occurs in dependence on the high voltage AC signal on the first input crossing the predetermined signal level. The timer may be configured to determine a period of time between successive crossings of the predetermined signal level by the high voltage AC signal. Alternatively or in addition, the timer may be configured to determine an absolute time when the predetermined signal level is crossed by the high voltage AC signal.

Alternatively or in addition, the at least one input to the DC isolator may be configured to receive a high voltage AC signal having a frequency of less than 500 Hz, such as a frequency of substantially 60 Hz or substantially 50 Hz for domestic mains or a frequency of substantially 400 Hz for mains in ships.

Alternatively or in addition, a high voltage AC signal in the context of the present invention may be an AC voltage of 50 Vrms or greater according to standards defined by the International Electrotechnical Commission, such as an AC voltage of substantially 110 Vrms or substantially 230 Vrms. Thus, the high voltage AC signal may be a domestic mains voltage signal or a mains voltage signal in a ship.

Alternatively or in addition, a low voltage signal in the context of the present invention may be an AC voltage of less than 50 Vrms or a DC voltage of less than 120 V according to standards defined by the International Electrotechnical Commission. More specifically, the low voltage signal may be a DC voltage of less than substantially 15 volts, such as a voltage of 12 volts. More specifically, the low voltage signal may be a DC voltage of substantially 5 volts or less, such as 3 volts.

According to a second aspect of the present invention, there is provided an integrated circuit having the signal level crossing detector circuit according to the first aspect of the present invention. The integrated circuit may be configured to form part of a home networking node.

Embodiments of the second aspect of the present invention may include one or more features of the first aspect of the present invention.

Figure 3A:
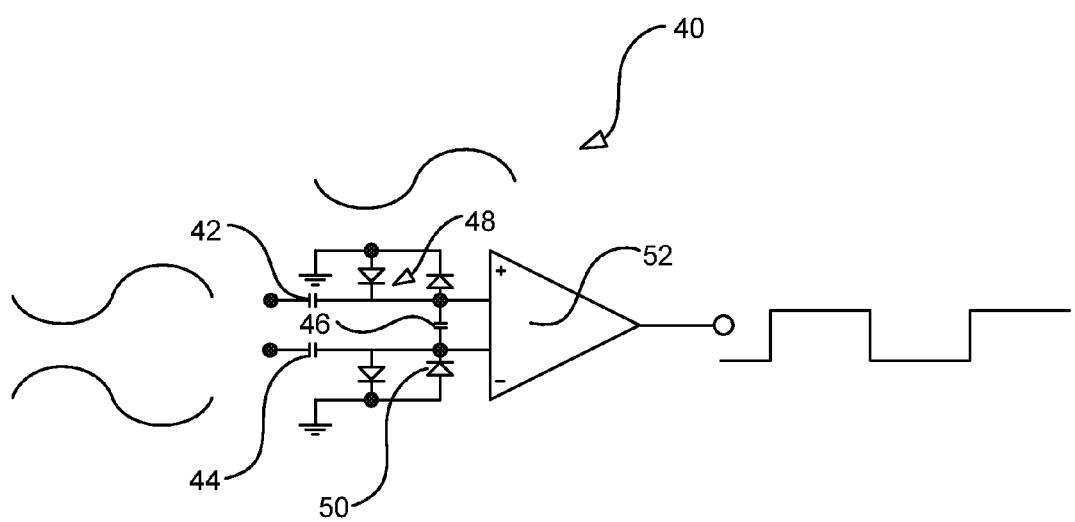
FIG. 3A is a circuit diagram of a first embodiment of signal level crossing detector circuit according to one or more embodiments of the present invention.

Referring now to FIG. 3A, a first embodiment of a signal level crossing detector circuit 40 is shown. The signal level crossing detector circuit 40 includes first 42, second 44 and third 46 series connected capacitors, a first 48 and a second 50 pair of back to back diodes and a comparator 52. The first and second capacitors 42, 44 constitute a DC isolator. A first plate of the first capacitor 42 constitutes a first input to the DC isolator and a first plate of the second capacitor 44 constitutes a second input to the DC isolator. Although not shown in FIG. 3A, a voltage source operative to provide a domestic mains signal, such as 230 Vrms at 50 Hz or 120 Vrms at 60 Hz, to the first and second inputs. The second plate of the first capacitor 42 is electrically connected to the non-inverting input of the comparator 52 and to a first plate of the third capacitor 46. The second plate of the second capacitor 44 is electrically connected to the inverting input of the comparator 52 and to a second plate of the third capacitor 46. Hence, the series connected first to third capacitors function as a capacitive divider with a reduced amplitude signal being developed across the third capacitor 46 in response to application of the mains signal to the first and second inputs. Hence, the comparator 52 is operative to switch its output between a high output level and a low output level in dependence on the voltage levels of the mains input signals crossing each other.

Figure 3B:
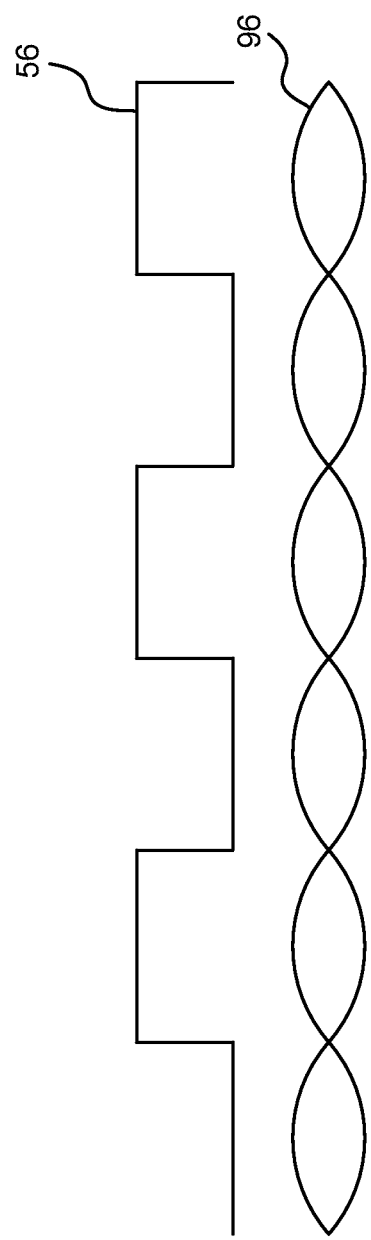
FIG. 3B s a graphical representation of input and output voltages for the circuit of FIG. 3A.

The operation of the circuit of FIG. 3A is illustrated in FIG. 3B, which shows the mains input signals 54 and the corresponding output from the comparator. As can be seen from FIG. 3B, the comparator output switches when the mains input signals cross each other. Although not shown in FIG. 3A, the comparator output gates a timer whereby the time period from one crossing to the next is determined. Alternatively the comparator output triggers the reading of a time signal from a real time clock or the like to thereby determine the absolute time when a crossing occurs. The design of such a timer or real time clock is within the scope of the ordinary design capabilities of the skilled person. The first 48 and a second 50 pairs of back to back diodes provide for ESD protection on the low voltage side of the DC isolator formed by the first and second capacitors 42, 44. The first, second and third capacitors 42, 44, 46 are discrete capacitors, such as Class X or Y capacitors for the first and second capacitors and a ceramic capacitor for the third capacitor, or are formed as part of a printed circuit board on which the comparator and other electronic circuitry is mounted, as is described below with reference to FIGS. 8, 9A and 9B. Alternatively, the third capacitor 46 is defined by a parasitic capacitance present at the input to the comparator 52 or found elsewhere on the printed circuit board.

Figure 4:
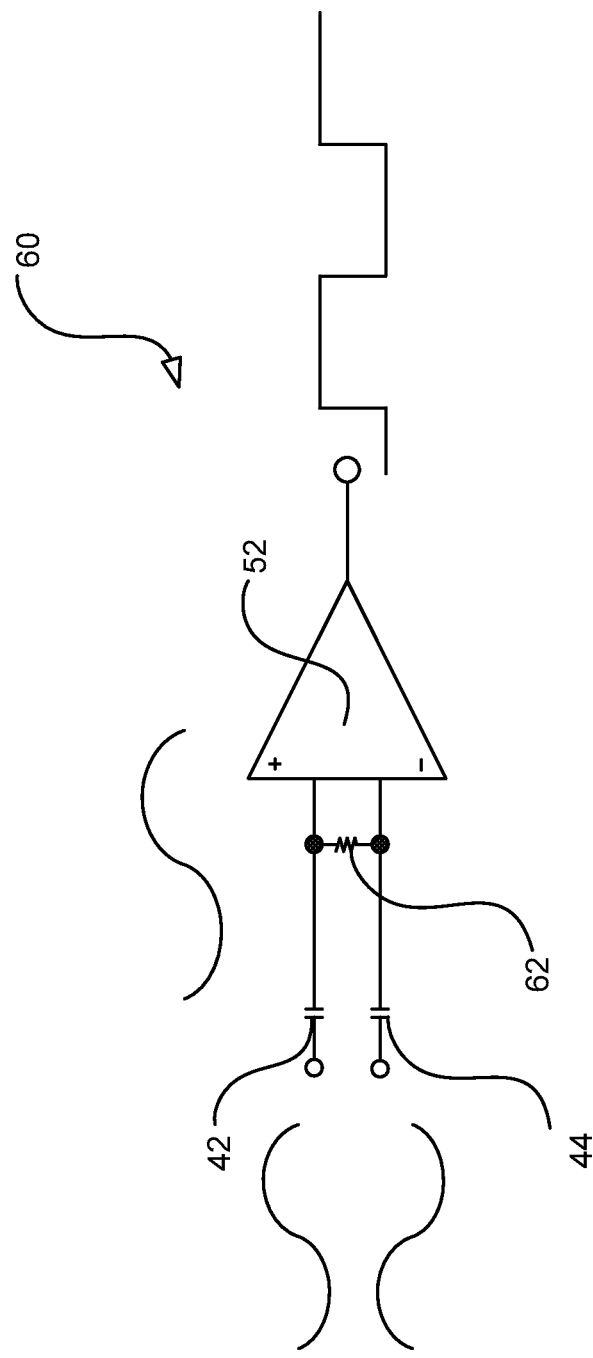
FIG. 4 is a circuit diagram of a second embodiment of signal level crossing detector circuit according to one or more embodiments of the present invention.

FIG. 4 illustrates a second embodiment of signal level crossing detector circuit 60. Components in common with the first embodiment of FIG. 3A are indicated with common reference numerals. The circuit 60 of FIG. 4 includes a DC isolator formed from first and second capacitors 42, 44 and a comparator 52 having a non-inverting input electrically connected to the second plate of the first capacitor 42 and an inverting input electrically connected to the second plate of the second capacitor 44. A resistor 62 is electrically connected across the non-inverting and inverting inputs of the comparator 52 instead of the third capacitor 46 of FIG. 3A. Hence, the first and second capacitors 42, 44 and resistor 62 form a voltage divider with a reduced amplitude signal being developed across the resistor in response to application of a mains signal to the first and second inputs. Otherwise the circuit of FIG. 4 is operative in the same fashion as the circuit of FIG. 3A such that the comparator 52 switches its output between a high output level and a low output level in dependence on the voltage levels of the mains input signals crossing each other. As with the circuit of FIG. 3A, the output of the comparator of the circuit of FIG. 4 gates a timer or is operative to trigger the reading of a time signal from a real time clock.

Figure 5:
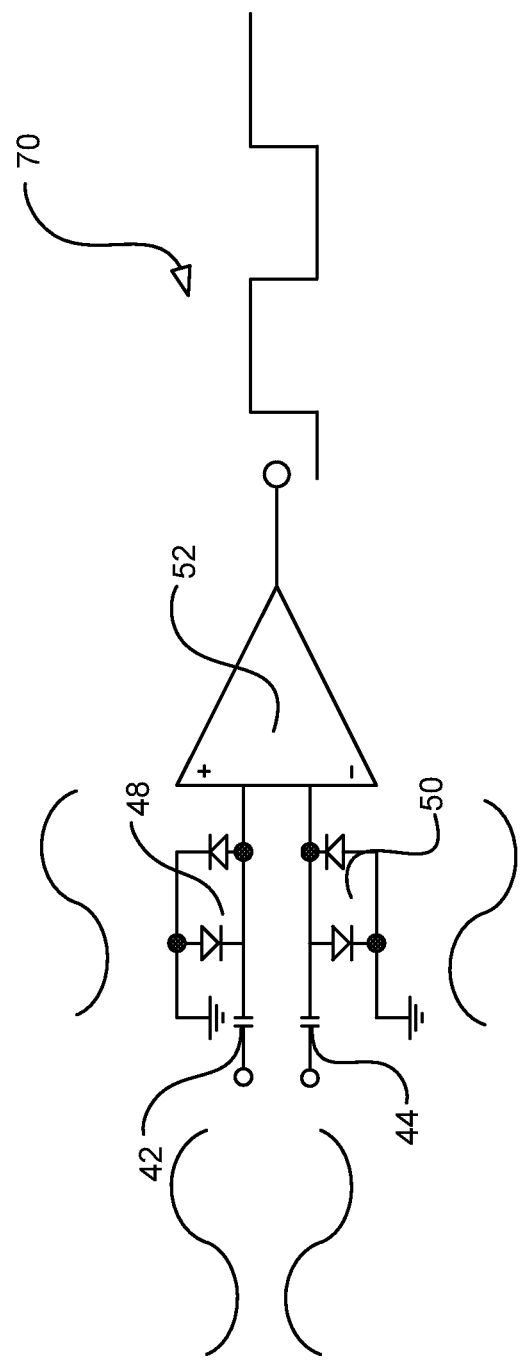
FIG. 5 is a circuit diagram of a third embodiment of signal level crossing detector circuit according to one or more embodiments of the present invention.

FIG. 5 illustrates a third embodiment of signal level crossing detector circuit 70. Components in common with the first embodiment of FIG. 3A are indicated with common reference numerals. The circuit of FIG. 5 includes a DC isolator formed from first and second capacitors 42, 44 and a comparator 52 having a non-inverting input electrically connected to the second plate of the first capacitor 42 and an inverting input electrically connected to the second plate of the second capacitor 44. Instead of the third capacitor 46 of the circuit of FIG. 3A between the non-inverting and inverting inputs to the comparator, the circuit of FIG. 5 includes a load to ground at each of the non-inverting and inverting inputs to the comparator. Each load has the form of a pair of back to back diodes 48, 50. As can be seen from the waveforms above the first pair of back to back diodes 48 and below the second pair of back to back diodes 50, the back to back diode pairs are operative to cause the voltage at each of the non-inverting and inverting inputs to the comparator 52 to swing between and saturate at each of a threshold voltage of a first of the diodes above ground and a threshold voltage of a second of the diodes below ground. In dependence on the changing voltage levels at the inputs to the comparator, the comparator 52 switches its output between a high output level and a low output level in dependence on the voltage levels of the mains input signals crossing each other. As with the circuit of FIG. 3A, the output of the comparator of the circuit of FIG. 5 gates a timer or is operative to trigger the reading of a time signal from a real time clock.

Embodiments of differential signal level crossing detector circuits have been described above with reference to FIGS. 3A, 4 and 5. Embodiments of single ended signal level crossing detector circuits will now be described with reference to FIGS. 6 and 7.

Figure 6:
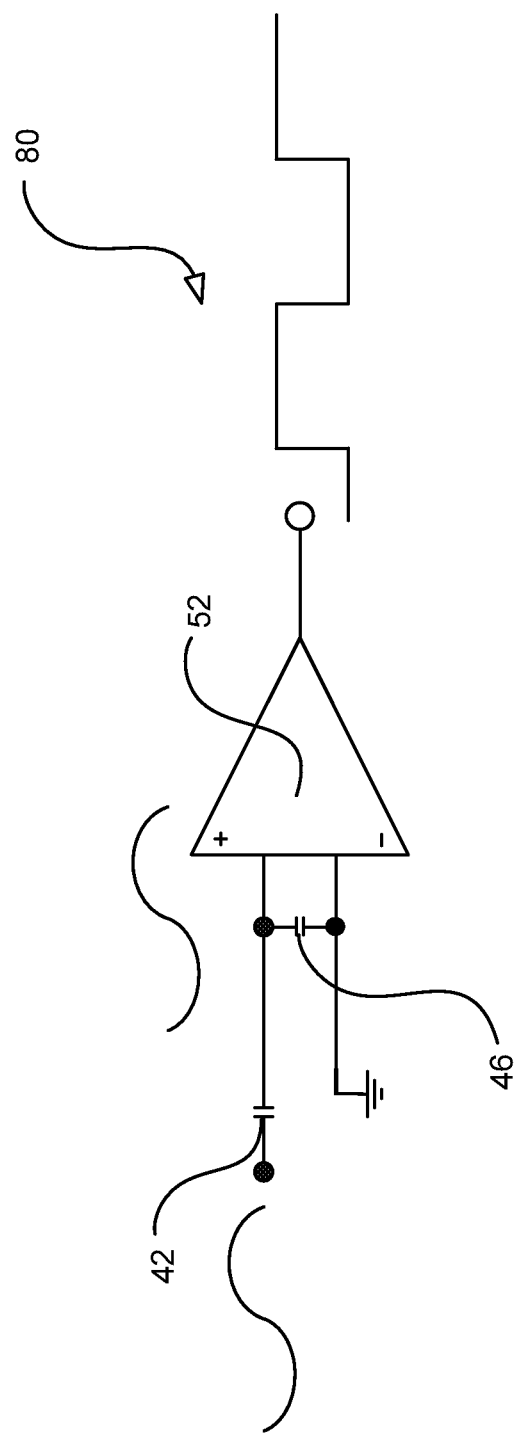
FIG. 6 is a circuit diagram of a fourth embodiment of signal level crossing detector circuit according to one or more embodiments of the present invention.

FIG. 6 illustrates a fourth embodiment of signal level crossing detector circuit 80. Components in common with the first embodiment of FIG. 3A are indicated with common reference numerals. The circuit 80 of FIG. 6 includes a first capacitor 42, which receives a mains voltage signal, and which is electrically connected to the non-inverting input of a comparator 52. The inverting input of the comparator 52 is connected to ground. A third capacitor 46 is connected across the non-inverting and inverting inputs to the comparator. Hence, the first and third capacitors are operative as a divider with a reduced amplitude signal being developed across the third capacitor and applied to the non-inverting and inverting inputs to the comparator. In use, the comparator of the circuit of FIG. 6 is operative such that its output voltage switches between a high output level and a low output level in dependence on the voltage level of the mains input signals crossing the predetermined voltage at the inverting input, i.e. ground. As with the circuit of FIG. 3A, the output of the comparator of the circuit of FIG. 6 gates a timer or is operative to trigger the reading of a time signal from a real time clock.

Figure 7:
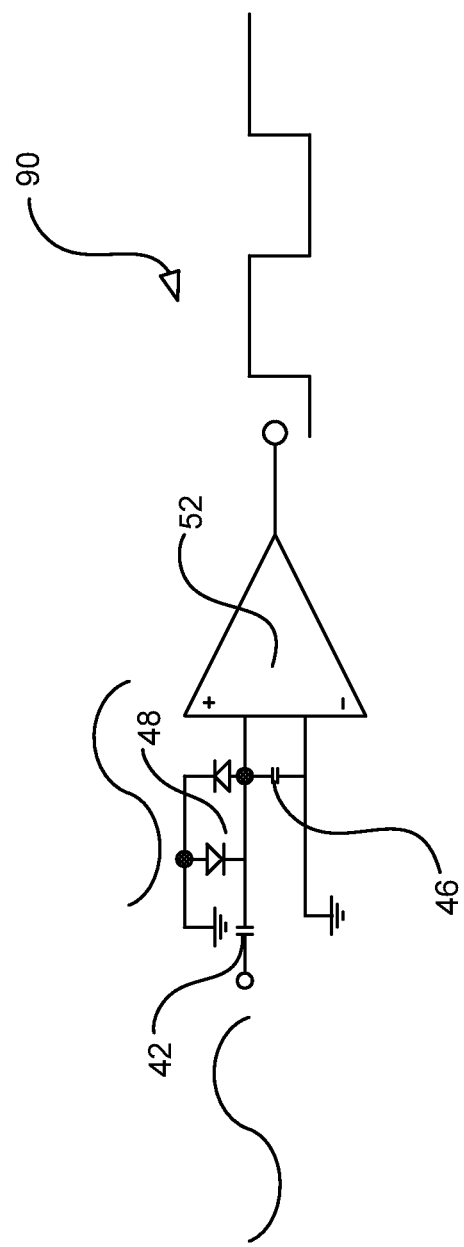
FIG. 7 is a circuit diagram of a fifth embodiment of signal level crossing detector circuit according to one or more embodiments of the present invention.

FIG. 7 illustrates a fifth embodiment of signal level crossing detector circuit 90. Components in common with the forth embodiment of FIG. 6 are indicated with common reference numerals. The circuit 90 of FIG. 7 is the same as the circuit of FIG. 6 with the following exception. A pair of back to back diodes 48 is connected between the non-inverting input to the comparator 52 and ground. The back to back diodes 48 provide ESD protection on the low voltage side of the DC isolator formed by the first capacitor. Otherwise the circuit of FIG. 7 operates in the same fashion as the circuit of FIG. 6.

Figure 8:
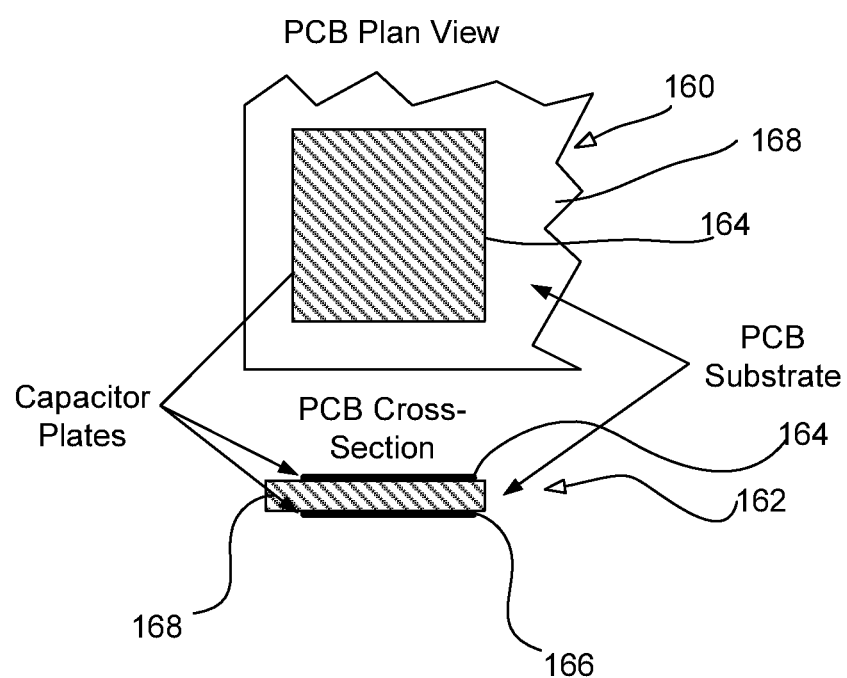
FIG. 8 is plan and cross-section views of a capacitor forming part of a signal level crossing detector circuit according to one or more embodiments of the present invention.
Figure 9B:
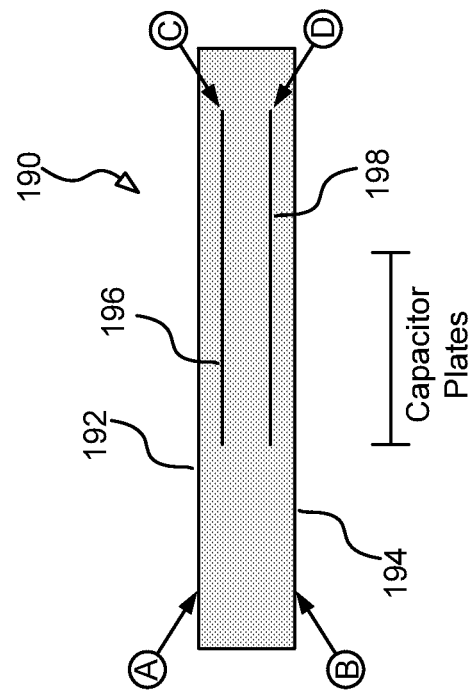
FIG. 9B is a cross-section view of a printed circuit board configured to form the circuit of FIG. 9A.

FIG. 8 illustrates plan 160 and cross-section 162 views of one of the first, second or third capacitors of FIG. 3A are shown in FIG. 8. As can be seen, each of the first 164 and second 166 plates of the capacitor are defined by respective metal layers on the top and bottom surfaces of the printed circuit board. The metal layers are disposed such that they share the same footprint and so that the non-conductive substrate 168 of the printed circuit board defines the dielectric of the capacitor. The formation of metal tracks and of larger area structures, such the metal layers of the first and second plates, on a printed circuit board substrate is a process that is well known to the skilled person. Alternatively, one or more capacitor plates are defined by metal layers embedded within the substrate. The provision of embedded metal tracks and of larger area structures, such the metal layers of the first and second plates, is a process that is well known to the skilled person. An application of embedded metal layers is described below with reference to FIGS. 9A and 9B.

In use, a domestic mains signal is applied to the inputs to the circuit of FIG. 3A. The configuration of the first 42 and second 44 capacitors is such that they form a potential divider with the third capacitor 46 to provide an attenuated representation of the domestic mains voltage signal across the third capacitor. For a domestic mains voltage signal of 230 Vrms at 50 Hz, a value of substantially 5 pF is used for each of the first and second capacitors along with a third capacitor having a capacitance of substantially 200 pF to provide an attenuated voltage swing across the third capacitor of about 3 volts.

Figure 9A:
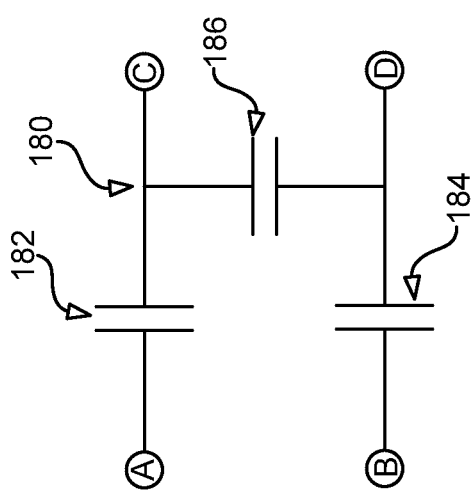
FIG. 9A is a circuit diagram of a capacitance divider forming part of the circuit of FIG. 3A.

FIG. 9A shows a capacitive divider forming part of the circuit of FIG. 3A having first 182 and second 184 capacitors and a third capacitor 186. As can be seen from the cross section view of the printed circuit board 190 shown in FIG. 9B, the first plate of the first capacitor 182 is defined by a first surface layer 192 on a first surface of the printed circuit board 190. The first plate of the second capacitor 184 is defined by a second surface layer 194 on a second opposite surface of the printed circuit board 190. The second plate of the first capacitor 182 is defined by a first embedded layer 196 within the printed circuit board and the second plate of the second capacitor is defined by a second embedded layer 198 having a footprint that overlaps a footprint of the first embedded layer. The first and second embedded layers 196, 198 are spaced apart from each other. Footprints of the first and second surface layers 192, 194 partially overlap the footprints of the first and second embedded layers 196, 198. Also, the second plate of the first capacitor 196 is closer to the first plate of the first capacitor 192 than the second plate of the second capacitor 198 is to the first plate of the first capacitor 192. Thus, the third capacitor includes first and second plates defined by the first and second embedded layers 196, 198 with the dielectric being defined by the part of the substrate between the first and second embedded layers 196, 198. The first 196 and second 198 embedded layers are spaced apart from each other to an extent less than a spacing between each of the first surface layer 192 and the first embedded layer 196 and of the second surface layer 194 and the second embedded layer 198. Hence, the third capacitor has a larger capacitance than each of the first capacitor and the second capacitor.

As described in the immediately preceding paragraph, the object is to reduce the mains voltage signal of 230 Vrms to a swing of 3 volts. A value of substantially 5 pF is used for each of the first and second capacitors. In one form, a printed circuit board formed according to normal production practices provides a third capacitance of substantially 15 pF to substantially 20 pF. Hence, the required 200 pF capacitance is achieved by using at least one of a parasitic component and an additional discrete component, such as a surface mounted capacitor, diode, etc. Where a parasitic component is used it may be in the form of at least one of parasitic capacitance and parasitic resistance. For example, if a parasitic resistance of 10M Ohms is used with first and second capacitance of 5 pF, the cut-off frequency (3 dB point) is about 3 kHz. Assuming a roll-off of 20 dB per decade, 50 Hz takes us two decades down. Hence, there is a division of about 100 at 50 Hz. The values for the capacitance and resistance can be changed in accordance with ordinary design practice to achieve a desired division factor and to operate with a specific mains frequency. In another form, the normal printed circuit board manufacturing process is modified, e.g. by increasing the number of layers or by including special thinned layers, etc., to thereby increase the third capacitance and decrease the capacitance of the first and second capacitors. Hence, the relative capacitance values can be determined to effect a desired voltage division.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output (s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

The invention claimed is:

1. A signal level crossing detector circuit comprising:
a DC isolator to receive an AC signal, and to provide DC isolation, wherein the DC isolator includes a first capacitor and a second capacitor, in which a first plate side of the first capacitor is coupled to a first input line of the AC signal and in which a first plate side of the second capacitor is coupled to a second input line of the AC signal, wherein the first and second capacitors are formed on a printed circuit board, in which the first plate side of the first capacitor and the first plate side of the second capacitor are formed respectively as conductive layers on opposite surfaces of the printed circuit board, the second plate side of the first capacitor is formed as a conductive layer within a dielectric layer of the printed circuit board and the second plate side of the second capacitor is formed as a conductive layer within the dielectric layer of the printed circuit board; and
a detector circuit having a first detector input coupled to a second plate side of the first capacitor, having a second detector input coupled to a second plate side of the second capacitor and a load disposed across the first and second detector inputs, wherein the first capacitor, the second capacitor and the load function as a voltage divider to place a reduced amplitude signal of the AC signal across the first and second detector inputs, in order for the detector circuit to operate at a lower voltage than the AC signal to provide an indication as an output of the detector circuit, when signal level crossing of the AC signal occurs at the first and second input lines, to synchronize the indication to the signal level crossing of the AC signal.

2. The signal level crossing detector circuit of claim 1, wherein the DC isolator is a differential DC isolator to provide differential input to the detector circuit.

3. The signal level crossing detector circuit of claim 1, wherein the detector circuit includes a comparator to compare voltages on the first and second detector inputs and to generate the output from the comparator to provide the indication.

4. The signal level crossing detector circuit of claim 1, wherein the detector circuit further includes a timer to determine a period of time between successive signal level crossing of the AC signal.

5. The signal level crossing detector circuit of claim 1, wherein the load includes a parasitic impedance.

6. The signal level crossing detector circuit of claim 1, wherein the load includes at least one of a parasitic impedance and an impedance provided by a discrete component.

7. The signal level crossing detector circuit of claim 1, wherein the load is a third capacitor.

8. The signal level crossing detector circuit of claim 7, wherein at least one of the first and second capacitors is a discrete Class X or Class Y capacitor and the third capacitor is a discrete ceramic capacitor.

9. The signal level crossing detector circuit of claim 7, wherein the second plate side of the first capacitor and the second plate side of the second capacitor are separated by the dielectric material of the printed circuit board to form the third capacitor.

10. The signal level crossing detector circuit of claim 1, wherein the conductive layers are metal layers formed to have a footprint that at least partially overlie one another.

11. The signal level crossing detector circuit of claim 9, wherein dielectric material spacing of the third capacitor is different than dielectric material spacing of the first capacitor and the second capacitor.

12. The signal level crossing detector circuit of claim 1, wherein the load is a resistor.

13. The signal level crossing detector circuit of claim 1, wherein the detector circuit further includes electrostatic discharge circuitry coupled to one of the detector inputs.

14. The signal level crossing detector circuit of claim 13, wherein the electrostatic discharge circuitry includes first and second diodes in a back to back configuration.

15. The signal level crossing detector circuit of claim 1, wherein the detector circuit further includes a first electrostatic discharge circuitry coupled to the first detector input and a second electrostatic discharge circuitry coupled to the second detector input.

16. The signal level crossing detector circuit of claim 1, wherein the conductive layers are metal layers formed to have a footprint that at least partially overlie one another.

17. An AC signal level crossing detector comprising:
a first terminal for coupling to a first side of AC lines used for carrying an AC signal;
a second terminal for coupling to a second side of the AC lines used for carrying the AC signal; and a circuit coupled to the first terminal and the second terminal, in which a first plate side of a first capacitor is coupled to the first terminal and a first plate side of a second capacitor is coupled to the second terminal to receive the AC signal, the circuit includes a detector having a first detector input coupled to a second plate side of the first capacitor, having a second detector input coupled to a second plate side of the second capacitor and a load disposed across the first and second detector inputs, wherein the first capacitor, the second capacitor and the load function as a voltage divider to place a reduced amplitude signal of the AC signal across the first and second detector inputs, in order for the detector to operate at a lower voltage than the AC signal to provide an indication as an output of the detector, when signal level crossing of the AC signal occurs at the first and second terminals, to synchronize the indication to the signal level crossing of the AC signal, and wherein the first and second capacitors are formed on a printed circuit board, in which the first plate side of the first capacitor and the first plate side of the second capacitor are formed respectively as conductive layers on opposite surfaces of the printed circuit board, the second plate side of the first capacitor is formed as a conductive layer within a dielectric layer of the printed circuit board and the second plate side of the second capacitor is formed as a conductive layer within the dielectric layer of the printed circuit board.

18. The AC signal level crossing detector of claim 17, wherein the load is a third capacitor, in which the second plate side of the first capacitor and the second plate side of the second capacitor are separated by the dielectric material of the printed circuit board to form the third capacitor.

19. The AC signal level crossing detector of claim 18, wherein the conductive layers are metal layers formed to have a footprint that at least partially overlie one another.

20. The AC signal level crossing detector of claim 19, wherein dielectric material spacing of the third capacitor is different than dielectric material spacing of the first capacitor and the second capacitor.

21. The AC signal level crossing detector of claim 17, wherein the detector is a comparator.

22. The AC signal level crossing detector of claim 17, wherein the first and second terminals are coupled to a 50 Hz or 60 Hz AC lines.

* * * * *